(12) United States Patent
Karmous

(10) Patent No.: US 11,600,697 B2
(45) Date of Patent: Mar. 7, 2023

(54) SEMICONDUCTOR DEVICE INCLUDING TRENCH ELECTRODE STRUCTURES

(71) Applicant: Infineon Technologies Austria AG, Villach (AT)

(72) Inventor: Alim Karmous, Dresden (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 16/991,090

(22) Filed: Aug. 12, 2020

(65) Prior Publication Data

US 2021/0057523 A1 Feb. 25, 2021

(30) Foreign Application Priority Data

Aug. 21, 2019 (DE) .......................... 102019122453.5

(51) Int. Cl.
| | |
|---|---|
| *H01L 29/06* | (2006.01) |
| *H01L 23/482* | (2006.01) |
| *H01L 29/423* | (2006.01) |
| *H01L 29/417* | (2006.01) |
| *H01L 29/40* | (2006.01) |
| *H01L 21/761* | (2006.01) |
| *H01L 21/762* | (2006.01) |

(Continued)

(52) U.S. Cl.
CPC ........ *H01L 29/0653* (2013.01); *H01L 21/761* (2013.01); *H01L 21/76202* (2013.01); *H01L 23/482* (2013.01); *H01L 29/0646* (2013.01); *H01L 29/401* (2013.01); *H01L 29/41741* (2013.01); *H01L 29/4236* (2013.01); *H01L 29/4238* (2013.01); *H01L 29/7397* (2013.01); *H01L 29/7813* (2013.01)

(58) Field of Classification Search
None
See application file for complete search history.

(56) References Cited

U.S. PATENT DOCUMENTS

| | | |
|---|---|---|
| 2003/0222297 A1 | 12/2003 | Krumrey et al. |
| 2009/0309156 A1 | 12/2009 | Darwish et al. |

(Continued)

FOREIGN PATENT DOCUMENTS

| | | |
|---|---|---|
| DE | 102005008354 A1 | 8/2006 |
| DE | 102014117297 A1 | 5/2015 |
| EP | 0583023 B1 | 1/1997 |

*Primary Examiner* — Ali Naraghi
(74) *Attorney, Agent, or Firm* — Murphy, Bilak & Homilier, PLLC

(57) ABSTRACT

A semiconductor device is proposed. The semiconductor device includes a semiconductor body including a first main surface. A plurality of trench electrode structures extend in parallel along a first lateral direction. A first one of the plurality of trench electrode structures includes a gate electrode. A gate contact is electrically connected to the gate electrode in a gate contact area. The gate contact area is arranged in a first section along the first lateral direction. An isolation structure is arranged between the gate contact and the semiconductor body in the gate contact area. A bottom side of the isolation structure is arranged between a bottom side of the first one of the plurality of trench electrode structures and the first main surface along a vertical direction. The gate contact extends up to or below the first main surface along the vertical direction.

16 Claims, 6 Drawing Sheets

(51) Int. Cl.
 *H01L 29/78* (2006.01)
 *H01L 29/739* (2006.01)

(56) References Cited

U.S. PATENT DOCUMENTS

| | | | |
|---|---|---|---|
| 2010/0078774 A1* | 4/2010 | Hirler | H01L 29/0653 257/652 |
| 2012/0326207 A1* | 12/2012 | Yoshimochi | H01L 29/0653 257/E29.198 |
| 2014/0319540 A1* | 10/2014 | Sugimoto | H01L 29/0653 257/77 |
| 2018/0269278 A1* | 9/2018 | Yamaguchi | H01L 29/7396 |
| 2018/0286975 A1* | 10/2018 | Hatakenaka | H01L 21/76897 |

* cited by examiner

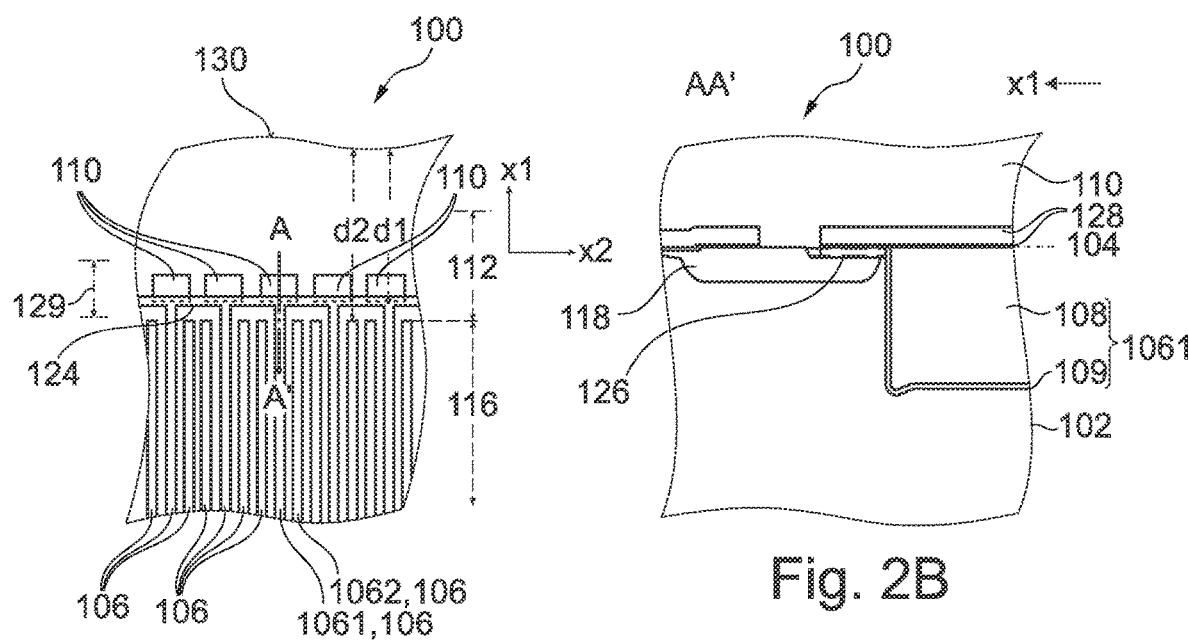
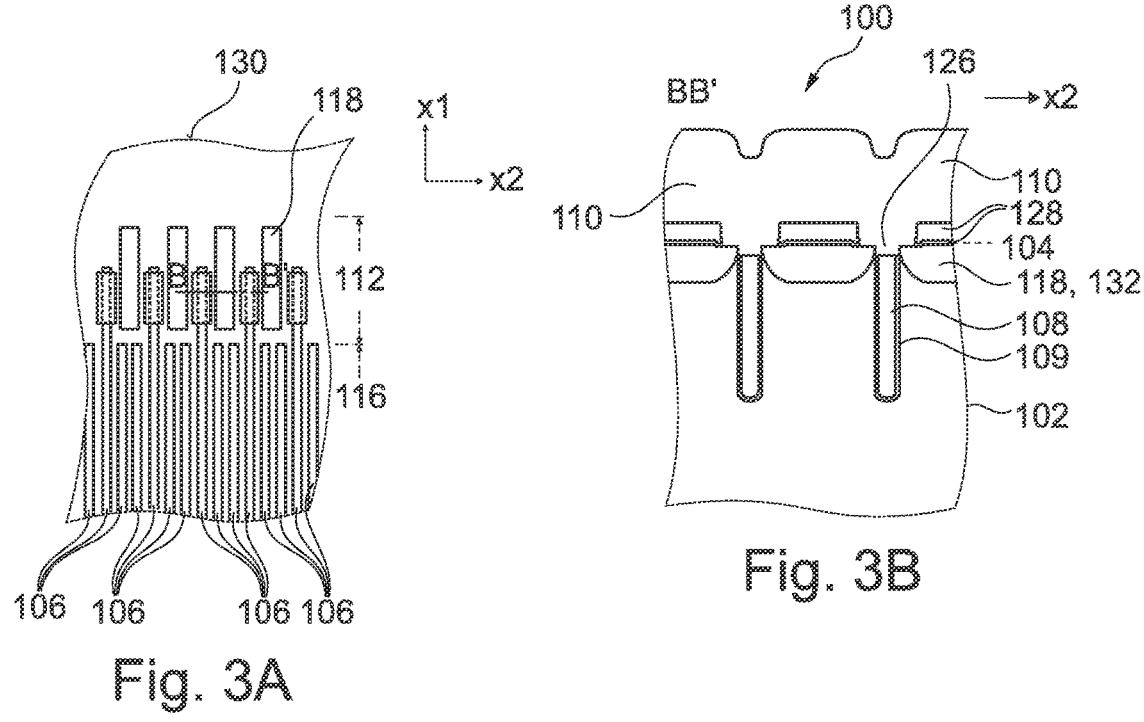

SEMICONDUCTOR DEVICE INCLUDING TRENCH ELECTRODE STRUCTURES

TECHNICAL FIELD

The present disclosure is related to semiconductor devices, in particular to semiconductor devices including trench electrode structures.

BACKGROUND

Semiconductor devices such as insulated gate bipolar transistors (IGBTs) or insulated gate field effect transistors (IGFETs), e.g. metal oxide semiconductor field effect transistor (MOSFETs), may include trench electrode structures, e.g. trench gate electrode structures and trench source electrode structures. Electrodes in the trench electrode structures may be electrically connected in electrode contact areas, e.g. a gate electrode contact area or a source electrode contact area. Scaling semiconductor devices to smaller dimensions may be accompanied by more challenging contacts to the electrodes. For example, manufacturing complexity and costs may increase when scaling semiconductor devices to smaller dimensions.

There is a need to improve contacts to electrodes in trench electrode structures of semiconductor devices.

SUMMARY

An example of the present disclosure relates to a semiconductor device. The semiconductor device includes a semiconductor body having a first main surface. The semiconductor device further includes a plurality of trench electrode structures extending in parallel along a first lateral direction. A first one of the plurality of trench electrode structures includes a gate electrode. The semiconductor device further includes a gate contact electrically connected to the gate electrode in a gate contact area. The gate contact area is arranged in a first section along the first lateral direction. The semiconductor device further includes an isolation structure arranged between the gate contact and the semiconductor body in the gate contact area. A bottom side of the isolation structure is arranged between a bottom side of the first one of the plurality of trench electrode structures and the first main surface along a vertical direction. The gate contact extends up to or below the first main surface along the vertical direction.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the embodiments and are incorporated in and constitute a part of this specification. The drawings illustrate embodiments of a semiconductor device and together with the description serve to explain principles of the embodiments. Further embodiments are described in the following detailed description and the claims.

FIG. 2A is a top view and FIG. 2B is a schematic cross-sectional view for illustrating an example of a gate contact arrangement of a semiconductor device including trench electrode structures.

FIG. 3A is a top view and FIG. 3B is a schematic cross-sectional view for illustrating another example of a gate contact arrangement of a semiconductor device including trench electrode structures.

DETAILED DESCRIPTION

Figure 1A:
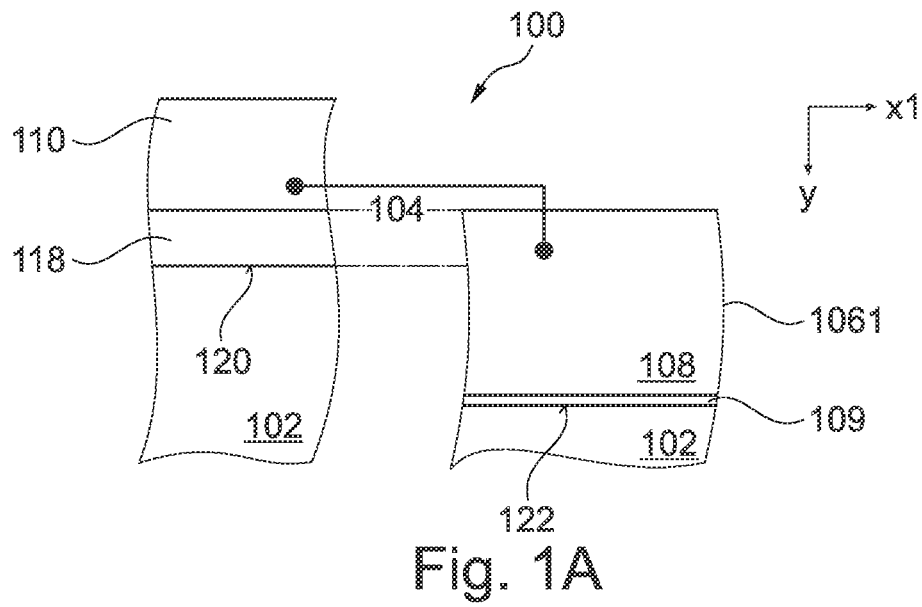
FIG. 1A is a schematic cross-sectional view and FIG. 1B is a schematic top view for illustrating an example of a semiconductor device including trench electrode structures.

In the following detailed description, reference is made to the accompanying drawings, which form a part thereof and in which are shown by way of illustrations specific embodiments in which a semiconductor device may be practiced. It is to be understood that other embodiments may be utilized and structural or logical changes may be made without departing from the scope of the present disclosure. For example, features illustrated or described for one embodiment can be used on or in conjunction with other embodiments to yield yet a further embodiment. It is intended that the present disclosure includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude additional elements or features. The articles "a", "an" and "the" are intended to include the plural as well as the singular, unless the context clearly indicates otherwise.

The term "electrically connected" describes a permanent low-resistive connection between electrically connected elements, for example a direct contact between the concerned elements or a low-resistive connection via a metal and/or heavily doped semiconductor material. The term "electrically coupled" includes that one or more intervening element(s) adapted for signal and/or power transmission may be between the electrically coupled elements, for example, elements that are controllable to temporarily provide a low-resistive connection in a first state and a high-resistive electric decoupling in a second state.

Ranges given for physical dimensions include the boundary values. For example, a range for a parameter y from a to b reads as $a \leq y \leq b$. A parameter y with a value of at least c reads as $c \leq y$ and a parameter y with a value of at most d reads as $y \leq d$.

The term "on" is not to be construed as meaning only "directly on". Rather, if one element is positioned "on" another element (e.g., a layer is "on" another layer or "on"

a substrate), a further component (e.g., a further layer) may be positioned between the two elements (e.g., a further layer may be positioned between a layer and a substrate if the layer is "on" said substrate).

For example, a semiconductor device may comprise a semiconductor body including a first main surface. The semiconductor device may further comprise a plurality of trench electrode structures extending in parallel along a first lateral direction. A first one of the plurality of trench electrode structures may include a gate electrode. A gate contact may be electrically connected to the gate electrode in a gate contact area. The gate contact area may be arranged in a first section along the first lateral direction. An isolation structure may be arranged between the gate contact and the semiconductor body in the gate contact area. A bottom side of the isolation structure may be arranged between a bottom side of the first one of the plurality of trench electrode structures and the first main surface along a vertical direction. The gate contact may extend up to or below the first main surface along the vertical direction.

The semiconductor device may be any device that is configured to control a conductivity of a channel close to a gate dielectric by a voltage applied to the gate electrode via the gate contact, for example. For example, the semiconductor device may be an IGBT or a MOSFET.

The semiconductor body may include or consist of a semiconductor material from the group IV elemental semiconductors, IV-IV compound semiconductor material, III-V compound semiconductor material, or II-VI compound semiconductor material. Examples of semiconductor materials from the group IV elemental semiconductors include, inter alia, silicon (Si) and germanium (Ge). Examples of IV-IV compound semiconductor materials include, inter alia, silicon carbide (SiC) and silicon germanium (SiGe). Examples of III-V compound semiconductor material include, inter alia, gallium arsenide (GaAs), gallium nitride (GaN), gallium phosphide (GaP), indium phosphide (InP), indium gallium nitride (InGaN) and indium gallium arsenide (InGaAs). Examples of II-VI compound semiconductor materials include, inter alia, cadmium telluride (CdTe), mercury-cadmium-telluride (CdHgTe), and cadmium magnesium telluride (CdMgTe).

The first one of the plurality of trench electrode structures may include a gate dielectric and the gate electrode. The gate dielectric may separate the gate electrode from the semiconductor body along at least one side of the first one of the plurality of trench electrode structures. The gate dielectric may include or consist of thermally grown or deposited silicon oxide, silicon nitride, silicon oxynitride, another deposited dielectric material or any combination thereof. A thickness of the gate dielectric may be adjusted for setting a threshold voltage in a target range, e.g. in a range from 1.0 V to 8 V, for example. The first one of the plurality of trench electrode structures may exclusively include the gate electrode and the gate dielectric or may include further conductive and/or dielectric structures in addition to the gate electrode and the gate dielectric. The gate electrode and any optional additional auxiliary electrode may include or consist of an electrode material or a combination of electrode materials, for example a doped semiconductor material (e.g., a degenerate doped semiconductor material) such as doped polycrystalline silicon, metal or metal compound, for example. The gate electrode may also include a combination of these materials, e.g. a liner material and a metal filling such as titanium nitride (TiN) and tungsten (W).

The semiconductor device may further include a second one of the plurality of trench electrode structures that may include a first source electrode. A source contact area may be arranged in a second section along the first lateral direction. The second one of the plurality of trench electrode structures may include a dielectric and the first source electrode. The dielectric and the first source electrode in the second one of the plurality of trench electrode structures may be concurrently formed with the gate dielectric and the gate electrode, for example. In this case, a cross-sectional view of the first one of the plurality of trench electrode structures may coincide with a cross-sectional view of the second one of the plurality of trench electrode structures, for example. A first number of electrodes of the first one of the plurality of trench electrode structures may be equal to a second number of electrodes of the second one of the plurality of trench electrode structures, for example. The first and second numbers may also differ from another, for example.

The gate contact may directly adjoin the semiconductor body at the first main surface, for example. The gate contact may further include or consist of a conductive material or a combination of conductive materials, for example a doped semiconductor material (e.g., a degenerate doped semiconductor material) such as doped polycrystalline silicon, metal, or metal compound, for example. The gate contact may also include a combination of these materials, e.g. a liner or adhesion material and an electrode material. Exemplary contact materials include one or more of titanium nitride (TiN) and tungsten (W), aluminum (Al), copper (Cu), alloys of aluminum or copper, for example AlSi, AlCu or AlSiCu, nickel (Ni), titanium (Ti), tungsten (W), tantalum (Ta), silver (Ag), gold (Au), platinum (Pt), palladium (Pd), for example. The gate contact may constitute or be part of a wiring area formed over the semiconductor body. The wiring area may include one, two, three or even more wiring levels that may include patterned or non-patterned metal layers and inter-layer dielectrics arranged between the patterned or non-patterned metal layers. Vias may electrically interconnect the different wiring levels, for example. The gate contact may adjoin the gate electrode and, optionally, the isolation structure at the first main surface or below the first main surface. For example, the gate contact may extend below the first main surface by filling at least part of a recess formed in the gate electrode and/or the isolation structure.

The isolation structure may be different from the gate dielectric or any other dielectric lining sidewalls and a bottom side of the plurality of trench electrode structures, for example. For example, the isolation structure may include or consist of thermally grown or deposited silicon oxide, silicon nitride, silicon oxynitride, another deposited dielectric material or any combination thereof. A thickness of the isolation structure may be adjusted for setting a dielectric strength between the semiconductor body and the gate contact, for example. For example, the isolation structure may comprise a dielectric including at least one of a STI, shallow trench isolation, and a LOCOS, local oxidation of silicon. A part of the LOCOS above the first main surface may be removed by a planarization process, for example. For example, the isolation structure may comprise a pn junction isolation, e.g. a p-doped region and an n-doped region. A pn junction may be formed at an interface between the p-doped region and the n-doped region. Dimensions and doping concentration profiles of the p-doped region and the n-doped region may be adjusted for setting a breakdown voltage between the semiconductor body and the gate contact, respectively, for example.

The gate contact area may be an area at the first main surface where the gate contact is located and electrically connected to the gate electrode of the first one of the plurality of trench electrode structures. The source contact area may be an area at the first main surface where the source contact is located and electrically connected to the source electrode of the second one of the plurality of trench electrode structures. The source contact area may at least partially overlap a transistor cell area of the semiconductor device.

The semiconductor device may allow for an improved contact to the gate electrode, e.g. by avoiding contacts having a high depth to width ratio of the gate contact. For example, depth to width ratios of smaller than two, or even smaller one may be achieved. The depth may be a vertical extent between the gate electrode and a top side of an interlayer dielectric arranged between the semiconductor body and a first, e.g. closest, wiring layer, e.g. metallization layer, above the semiconductor body, for example. For example, the depth may be a vertical extent of a contact plug or contact line, for example. The width may be a lateral extent along a second lateral direction that is perpendicular to the first lateral direction and perpendicular to the vertical direction, for example.

For example, an extent of the gate contact at the first main surface along a second lateral direction may be larger than an extent of the first one of the plurality of trench electrode structures at the first main surface along the second lateral direction. This may allow for avoiding complex and high-priced contacts having large ratios of contact depth to contact width that may require complex metal stacks, for example.

For example, the semiconductor device may further include a second one of the plurality of trench electrode structures that may include a first source electrode. A source contact area may be arranged in a second section along the first lateral direction. The gate contact area may be arranged between an edge of the semiconductor body and the source contact area. A first lateral distance between the first one of the plurality of trench electrode structures and the edge along the first lateral direction may be smaller than a second lateral distance between the second one of the plurality of trench electrode structures and the edge along the first lateral direction. Thus, an extension of the first one of the plurality of trench electrode structures may end closer to the edge than the second one of the plurality of trench electrode structures. For example, a lateral distance between the gate contact and the edge along the first lateral direction may be in a range between the first lateral distance and the second lateral distance.

For example, a first part of the first one of the plurality of trench electrode structures is arranged between the isolation structure and the first main surface. A second part of the first one of the plurality of trench electrode structures may be arranged in a transistor cell area. A drift zone of the semiconductor device may adjoin a bottom side of the second part of the first one of the plurality of trench electrode structures, for example. A depth of the first part of the first one of the plurality of trench electrode structures may be smaller than a depth of the second part of the first one of the plurality of trench electrode structures, for example.

For example, the first one of the plurality of trench electrode structures and a third one of the plurality of trench electrode structures may be merged by a first transverse trench electrode structure extending along the second lateral direction in the gate contact area. The transverse trench electrode structure may electrically connect the gate electrode in the first one of the plurality of trench electrode structures and a gate electrode in the third one of the plurality of trench electrode structures, for example.

For example, the pn junction isolation may be surrounded by an auxiliary trench electrode structure. The auxiliary trench electrode structure may merge the one of the plurality of trench electrode structures in the gate contact area. The auxiliary trench electrode structure and the plurality of trench electrode structures may be concurrently formed, for example. The auxiliary trench electrode structure may electrically interconnect the gate electrode in the first one of the plurality of trench electrode structures and the gate contact, for example.

For example, a bottom side of the gate contact may adjoin each one of an electrode in the auxiliary trench electrode structure and the pn junction isolation. The pn junction isolation and a dielectric in the auxiliary trench electrode structure, e.g. a dielectric concurrently formed with the gate dielectric, may electrically insulate the gate contact from the semiconductor body, for example.

For example, the semiconductor device may further comprise a first mesa region arranged between the first one of the plurality of trench electrode structures and the second one of the plurality of trench electrode structures. The semiconductor device may further comprise a first source contact extending into the semiconductor body from the first main surface in the source contact area. Each of the first source electrode and the first mesa region may adjoin a bottom side of the first source contact. The first source contact and the gate electrode may be electrically connected at the bottom side of the first source contact, and, optionally, at a sidewall part of the first source contact. The first source contact and a body region of the semiconductor device may be electrically connected at the bottom side of the first source contact, e.g. via an intermediate highly doped body contact region. For example, the semiconductor device may further comprise a source region adjoining the first one of the plurality of trench electrode structures. A sidewall portion of the first source contact may adjoin the source region, for example. A bottom side portion of the first source contact may adjoin the source region, for example. The first source contact and source region may be electrically connected at a bottom side portion and/or a sidewall portion of the first source contact, for example.

For example, an extent of the first source contact along the second lateral direction at the first main surface may be larger than an extent of the first mesa region along the second lateral direction at the first main surface.

For example, the semiconductor device may further comprise a third one of the plurality of trench electrode structures including a second source electrode. The semiconductor device may further comprise a second mesa region arranged between the second one of the plurality of trench electrode structures and the third one of the plurality of trench electrode structures. The second one of the plurality of trench electrode structures and the third one of the plurality of trench electrode structures may be merged by a second transverse trench electrode structure extending along the second lateral direction through the second mesa region. The second transverse trench electrode structure may electrically connect the first source electrode in the second one of the plurality of trench electrode structures and the second source electrode in the third one of the plurality of trench electrode structures, for example. The terms "first", "second", "third" source electrode may refer to concurrently formed separate parts of one source electrode, for example.

For example, the semiconductor device may further comprise a third one of the plurality of trench electrode structures including a second source electrode. The semiconductor device may further comprise a second mesa region arranged between the second one of the plurality of trench electrode structures and the third one of the plurality of trench electrode structures. The semiconductor device may further comprise a fourth one of the plurality of trench electrode structures including a third source electrode. The semiconductor device may further comprise a third mesa region arranged between the third one of the plurality of trench electrode structures and the fourth one of the plurality of trench electrode structures. The source contact in the source contact area may extend into the semiconductor body from the first main surface. Each one of the second mesa region, the second source electrode and the third mesa region may adjoin a bottom side of the source contact. The second mesa region and the third mesa region may be inactive mesa regions, e.g. mesa regions that do not contribute to a load current by a channel current controlled by a gate voltage, for example.

For example, a method of manufacturing a semiconductor device may comprise forming a plurality of trench electrode structures in a semiconductor body including a first main surface, wherein the plurality of trench electrode structures extend in parallel along a first lateral direction. A first one of the plurality of trench electrode structures may include a gate electrode, and a second one of the plurality of trench electrode structures may include a first source electrode. The method may further comprise forming a gate contact electrically connected to the gate electrode in a gate contact area, wherein the gate contact area is arranged in a first section along the first lateral direction, and a source contact area is arranged in a second section along the first lateral direction. The method may further comprise forming an isolation structure arranged between the gate contact and the semiconductor body in the gate contact area, wherein a bottom side of the isolation structure is arranged between a bottom side of the first one of the plurality of trench electrode structures and the first main surface along a vertical direction, and wherein the gate contact extends up to or below the first main surface along the vertical direction.

For example, the method may further comprise forming a recess in the isolation structure. The method may further comprise forming a part of the first one of the plurality of trench electrode structures in the recess. The recess may be filled with the gate contact that is electrically connected to the gate electrode in the first one of the plurality of trench electrode structures via a bottom side of the recess and/or a sidewall portion of the recess, for example.

The examples described above may be examples of a power semiconductor device or examples for manufacturing a power semiconductor device. The power semiconductor device or an electrical structure (e.g. transistor) of the power semiconductor device may have a breakdown voltage or blocking voltage of more than 100 V (e.g. a breakdown voltage of 200 V, 300 V, 400V or 500V) or more than 500 V (e.g. a breakdown voltage of 600 V, 5 700 V, 800V or 1000V) or more than 1000 V (e.g. a breakdown voltage of 1200 V, 1500 V, 1700V, 2000V, 3300V or 6500V), for example.

The examples and features described above and below may be combined.

More details and aspects are mentioned in connection with the examples described above or below. Processing the semiconductor body may comprise one or more optional additional features corresponding to one or more aspects mentioned in connection with the proposed concept or one or more examples described above or below.

The methods may be applied for manufacturing the semiconductor device as described with respect to any of the above examples or any of the examples described below in connection with the figures. In at least some examples of the method, the following features (if applicable) apply, alone or in combination:

(i) forming the recess comprises removing at least part of the first one of the plurality of trench electrode structures;

(ii) forming the recess comprises removing at least part of the isolation structure;

(iii) the plurality of trench electrode structures and the first transverse trench electrode structure are concurrently formed;

(iv) the plurality of trench electrode structures and the auxiliary trench electrode structure are concurrently formed;

(v) the plurality of trench electrode structures and the second transverse trench electrode structure are concurrently formed;

(vi) the gate contact and the first source contact are concurrently formed;

(vii) the gate contact and the second source contact are concurrently formed.

The aspects and features mentioned and described together with one or more of the previously described examples and figures, may as well be combined with one or more of the other examples in order to replace a like feature of the other example or in order to additionally introduce the feature to the other example. For example, exemplary details described with reference to the semiconductor device examples above, e.g. details on materials, functions, arrangements or dimensions of structural elements, e.g. the plurality of trench electrode structures, the gate contact, the first and second source contacts, the isolation region, correspondingly apply to the semiconductor device examples described further below with reference to the drawings.

The description and drawings merely illustrate the principles of the disclosure. Furthermore, all examples recited herein are principally intended expressly to be only for illustrative purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation, or step may include or may be broken into multiple sub-acts, -functions, -processes, -operations or -steps, respectively. Such sub acts may be included and part of the disclosure of this single act unless explicitly excluded.

Figure 1B:
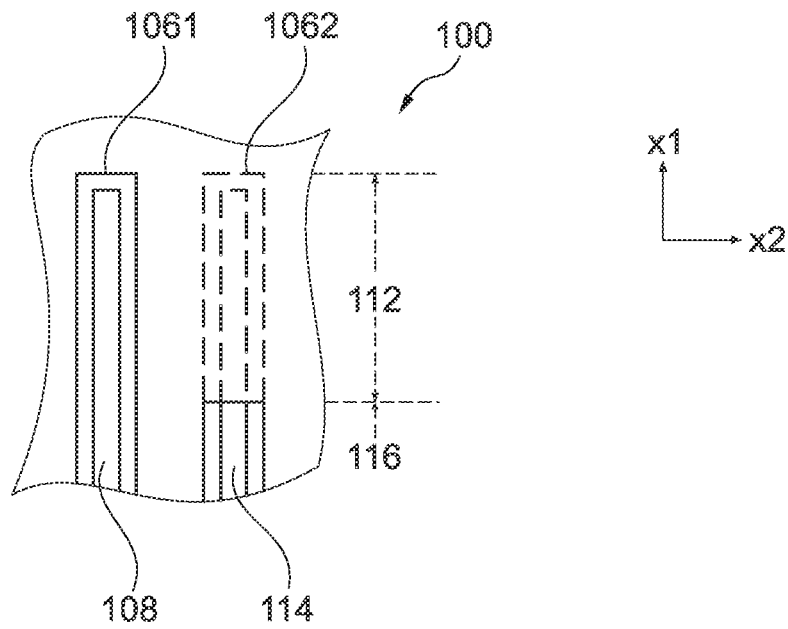

Referring to the schematic cross-sectional view of FIG. 1A and the schematic top view of FIG. 1B, an example of a semiconductor device 100 is illustrated. Functional and structural details described with respect to structural device elements above, e.g., inter alia, the trench electrode structures, the semiconductor body, the gate and source contacts, the isolation structure, shall likewise apply to the structural device elements described with reference to FIGS. 1A and 1B.

The semiconductor device 100 includes a semiconductor body 102 including a first main surface 104. A first one 106₁ and a second one 106₂ of a plurality of trench electrode structures extend in parallel along a first lateral direction x1. The first one 106₁ of the plurality of trench electrode structures includes a gate electrode 108 and a gate dielectric 109. The semiconductor device 100 further includes a gate contact 110 electrically connected to the gate electrode 108 in a gate contact area 112. The gate contact area 112 is arranged in a first section along the first lateral direction x1. The second one 106₂ of the plurality of trench electrode structures includes a first source electrode 114. A source contact area 116 is arranged in a second section along the first lateral direction x1.

The semiconductor device 100 further includes an isolation structure 118 arranged between the gate contact 110 and the semiconductor body 102 in the gate contact area 112. A bottom side 120 of the isolation structure 118 is arranged between a bottom side 122 of the first one 106₁ of the plurality of trench electrode structures and the first main surface 104 along a vertical direction y. The gate contact 110 extends below the first main surface 104 along the vertical direction y. For example, the gate contact may fill a recess formed in the isolation structure 118.

Referring to the schematic top view of FIG. 2A and the schematic cross-sectional view of FIG. 2B along intersection line AA' of FIG. 2A, another example of the semiconductor device 100 is illustrated.

The semiconductor device 100 includes a plurality of trench electrode structures 106. The gate contact 110 is electrically connected to the plurality of trench electrode structures that includes a gate electrode, respectively. The first one 106₁ of the trench electrode structures 106 includes a gate dielectric 109. The first one 106₁ of the plurality of trench electrode structures 106 and other ones of the plurality of trench electrode structures 106 including a gate electrode are merged by a first transverse trench electrode structure 124 extending along the second lateral direction x2 in the gate contact area 112.

The isolation structure 118 exemplified in FIG. 2B is formed as a LOCOS structure in the gate contact area 112. A part of a recess 126 in the isolation structure 118 is filled with a first part of the first one 106₁ of the plurality of trench electrode structures 106. The first part is arranged between the isolation structure 118 and the first main surface 104. Another part of the recess 126 is filled with the gate contact 110. The gate contact 110 extends through an opening in an interlayer dielectric 128 arranged over the isolation structure 118 and the first one 106₁ of the plurality of trench electrode structures 106. The isolation structure 118 extends along a section 129 in the first lateral direction x1.

The gate contact area 112 is arranged between an edge 130 of the semiconductor body 102 and the source contact area 116. A first lateral distance d1 between the first one 106₁ of the plurality of trench electrode structures 106 and the edge 130 along the first lateral direction x1 is smaller than a second lateral distance d2 between the second one 106₂ of the plurality of trench electrode structures 106 and the edge 130 along the first lateral direction x1.

Referring to the schematic top view of FIG. 3A and the schematic cross-sectional view of FIG. 3B along intersection line BB' of FIG. 3A, another example of the semiconductor device 100 is illustrated.

In the example illustrated in FIG. 3A, the LOCOS structure of the isolation structure 118 is limited to LOCOS regions 132 separated from another along the second lateral direction x2. The trench electrode structures 106 extending into the gate contact area 112, e.g. trench electrode structures including the gate electrode 108, are recessed in the gate contact area 112. The recesses 126 are filled with the gate contact 110 electrically connected to the gate electrode 108 at a bottom side of the recesses 126.

Figure 4A:
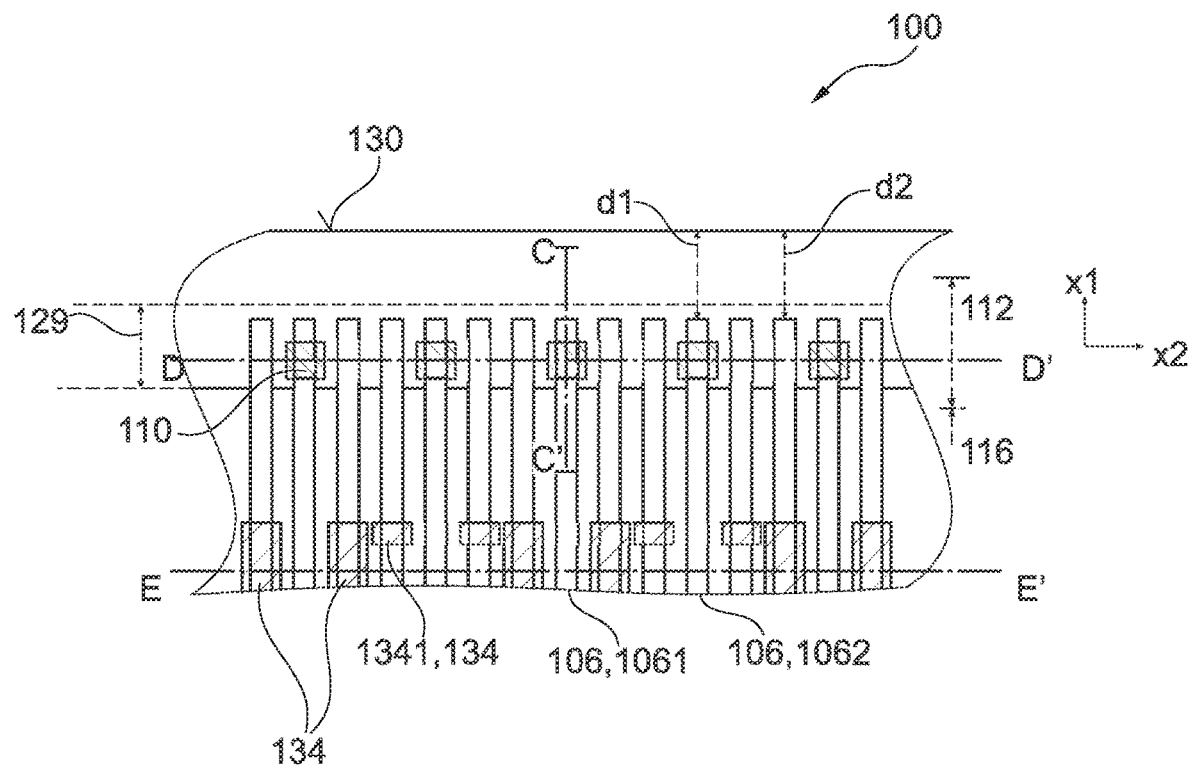
FIG. 4A is a top view and FIGS. 4B, 4C and 4D are schematic cross-sectional views for illustrating an example of a gate contact arrangement and a source contact arrangement of a semiconductor device including trench electrode structures.
Figure 4B:
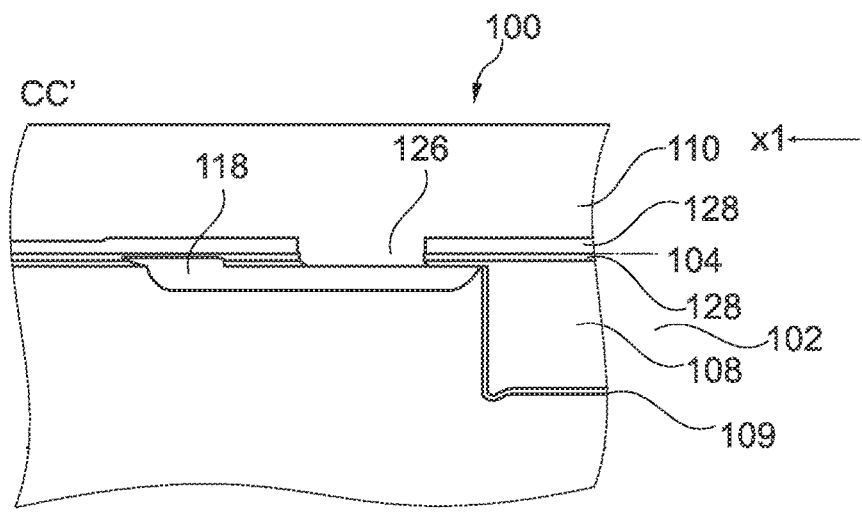
Figure 4C:
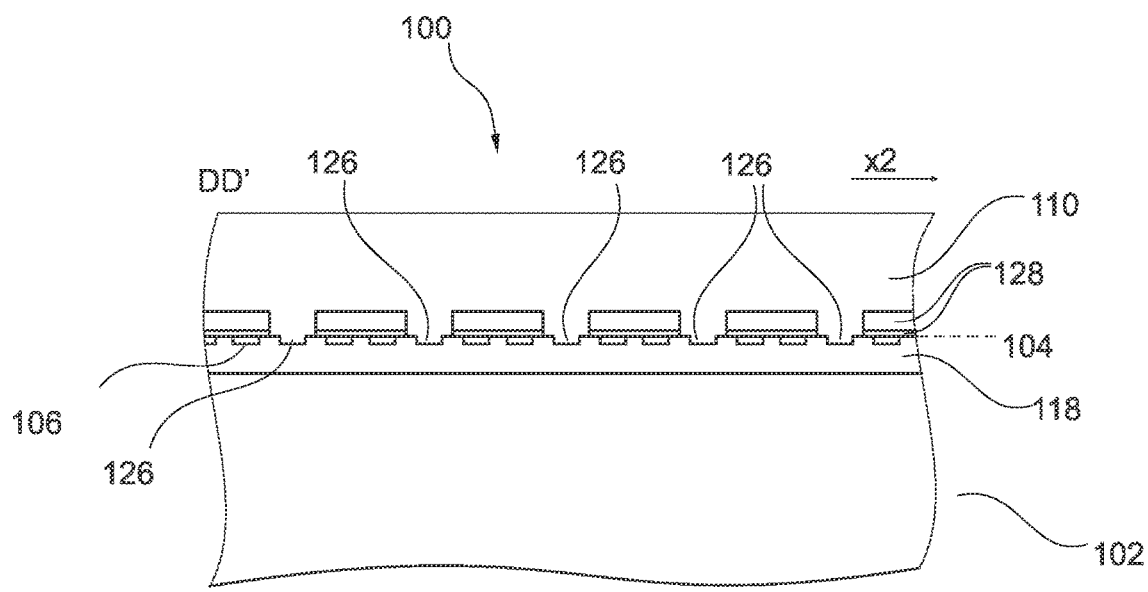
Figure 4D:
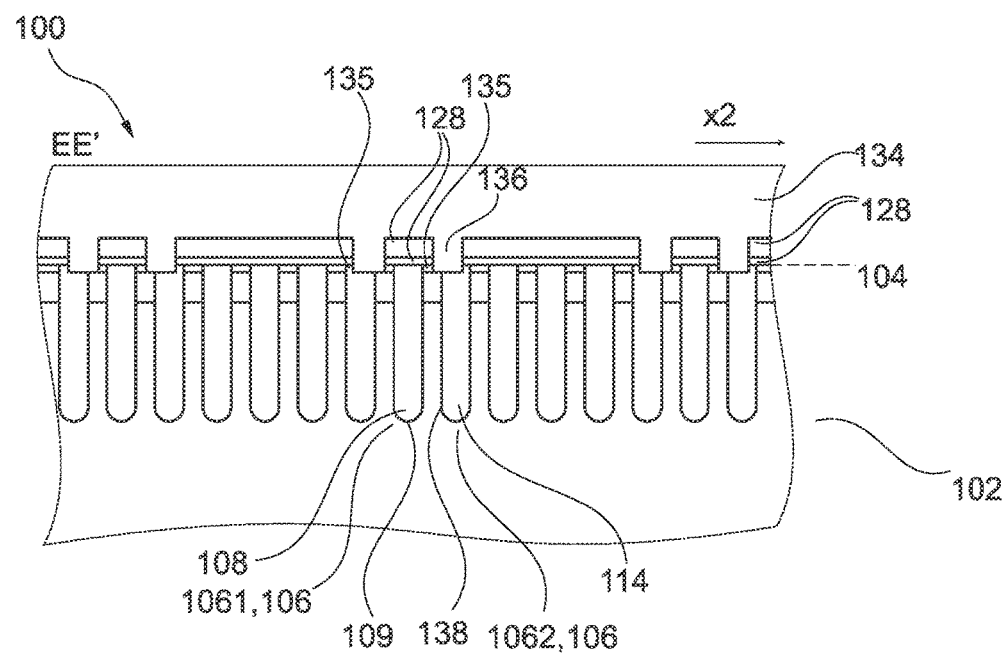

Referring to the schematic top view of FIG. 4A, and the schematic cross-sectional view of FIG. 4B along intersection line CC' of FIG. 4A, and the schematic cross-sectional view of FIG. 4C along intersection line DD' of FIG. 4A, and the schematic cross-sectional view of FIG. 4D along intersection line EE' of FIG. 4A, another example of the semiconductor device 100 is illustrated.

In the example illustrated in FIG. 4A, the LOCOS structure of the isolation structure 118 is similar to the isolation structure 118 illustrated in the example of FIG. 3A. The LOCOS structure of the isolation structure 118 also extends along the section 129 in the first lateral direction x1.

The example illustrated in FIG. 4A differs from the example illustrated in FIG. 3A in that the first lateral distance d1 between the first one 106₁ of the plurality of trench electrode structures 106 and the edge 130 along the first lateral direction x1 is equal to the second lateral distance d2 between the second one 106₂ of the plurality of trench electrode structures 106 and the edge 130 along the first lateral direction x1. The recesses 126 extend into the gate electrode 108 and are arranged between the isolation structure 118 and the first main surface 104.

Referring to the schematic cross-sectional views of FIGS. 4B and 4C, the gate contact 110 adjoins the isolation structure 118 in the recess 126 of trench electrode structures 106 that include the gate electrode 108. Other trench electrode structures 106 having an electrode that is not connected to the gate contact, e.g. the second one 106₂ of the plurality of trench electrode structures 106, are electrically insulated from the gate contact 110 by the interlayer dielectric 128.

The cross-sectional view of FIG. 4D illustrates an example of a source contact 134 in the source contact area 116. The source contact 134 extends into the semiconductor body 102 from the first main surface 104 in the source contact area 116 and adjoins a source region 135. The source contact 134 fills a second recess 136. The second recess 136 may be formed by removing material of a mesa region 138 and of a trench electrode structure 106 including a source electrode, i.e. an electrode that is electrically separated from the gate electrode 108. A width of the source contact 134 at the first main surface 104, e.g. an extension of the source contact 134 along the second lateral direction x2 at the first main surface 104, may be larger than a width of the mesa region 138 at the first main surface 104, e.g. an extension of the mesa region 138 along the second lateral direction x2 at the first main surface 104, for example.

The source contact 134 may also fill a recess that extends into neighboring mesa regions that adjoin opposite sidewalls of an intermediate trench electrode structure, for example (see source contact 134₁ in FIG. 4A, for example).

Figure 5:
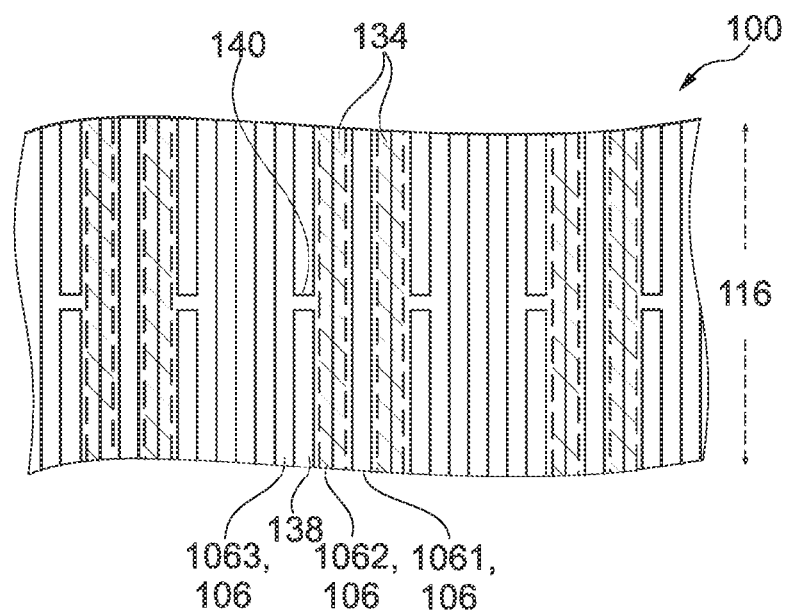
FIG. 5 is a top view for illustrating another example of a source contact arrangement of a semiconductor device including trench electrode structures interconnected by a transverse trench electrode structure.

Another example of an electric interconnection of source electrodes in neighboring trench electrode structures 106 is schematically illustrated in the top view of FIG. 5. Source electrodes in neighboring trench electrode structures 106 may be electrically connected together by merging the neighboring trench electrode structures 106, e.g. the second one 106₂ of the plurality of trench electrode structures 106 and a third one 1063 of the plurality of trench electrode structures 106, by a second transverse trench electrode structure 140 extending along the second lateral direction x2 through the mesa region 138.

Figure 6:
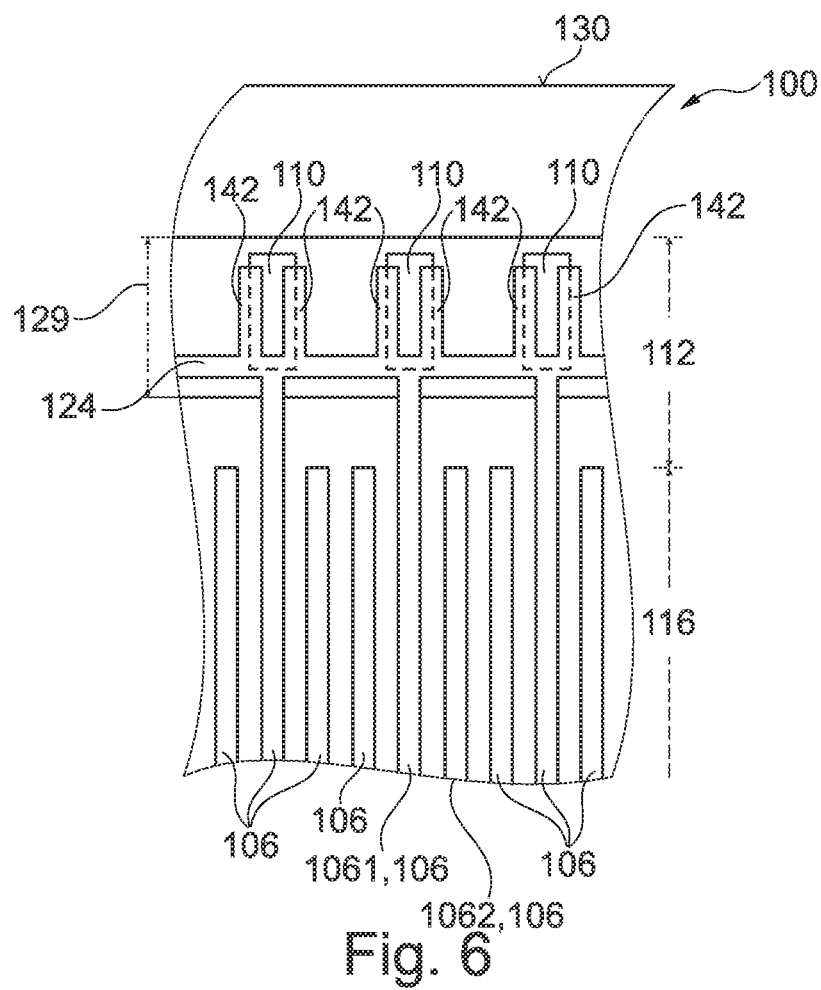
FIG. 6 is a top view for illustrating another example of a gate contact arrangement of a semiconductor device including trench electrode structures.

The schematic top view of FIG. 6 illustrates another example of a gate contact arrangement in the gate contact area 112. The gate contact arrangement of FIG. 5 differs from the gate contact arrangement illustrated in FIG. 2A by branch-off electrode structures 142 diverging from the first transverse trench electrode structure 124. An electric contact between the gate electrode 108 and the gate contact 110 may be improved by using an additional contact interface between the gate contact 110 and an electrode formed in the branch-off electrode structures 142, for example.

Figure 7A:
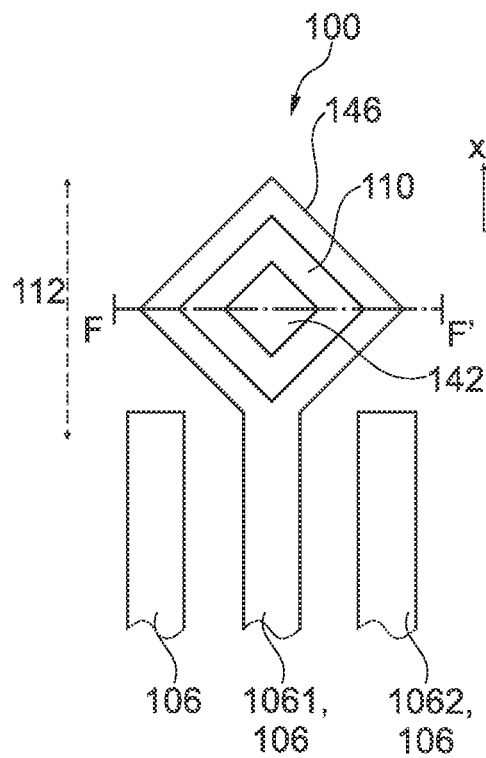
FIG. 7A is a top view and FIG. 7B is a schematic cross-sectional view for illustrating an example of a gate contact arrangement including a pn junction isolation.
Figure 7B:
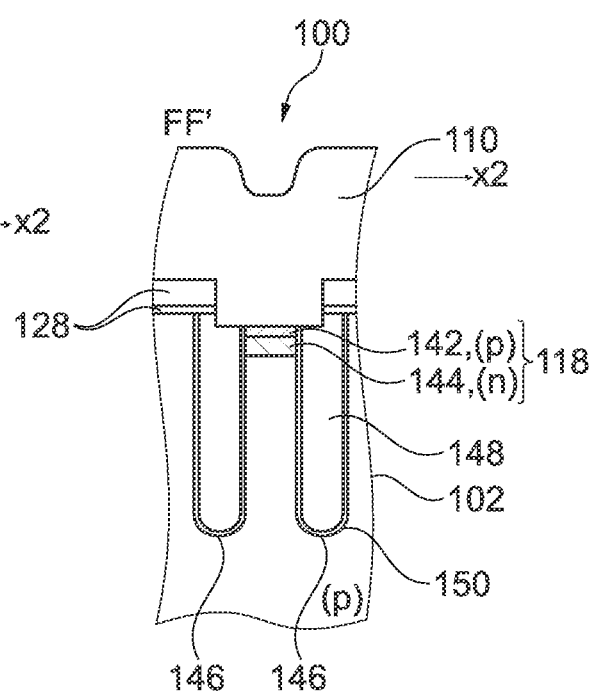

Referring to the schematic top view of FIG. 7A and the schematic cross-sectional view of FIG. 7B along intersection line FF' of FIG. 7A, another example of the semiconductor device 100 is illustrated.

The isolation structure 118 of the semiconductor device 100 includes a first and a second pn junction isolation. The first pn junction isolation includes a p-doped region 142 and an n-doped region 144. The second pn junction isolation includes the n-doped region 144 and a p-doped region of the semiconductor body 102 that adjoins the n-doped region 144. The pn junction isolations are surrounded by an auxiliary trench electrode structure 146. The auxiliary trench electrode structure 146 merges the one 1061 of the plurality of trench electrode structures 106 in the gate contact area 112. A bottom side of the gate contact 110 adjoins each of an electrode 148 in the auxiliary trench electrode structure 146, an auxiliary trench dielectric 150, and the pn junction isolation.

Figure 8A:
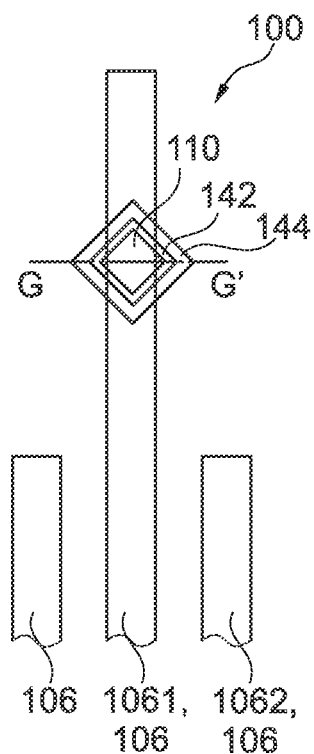
FIG. 8A is a top view and FIG. 8B is a schematic cross-sectional view for illustrating an example of a gate contact arrangement including another pn junction isolation.
Figure 8B:
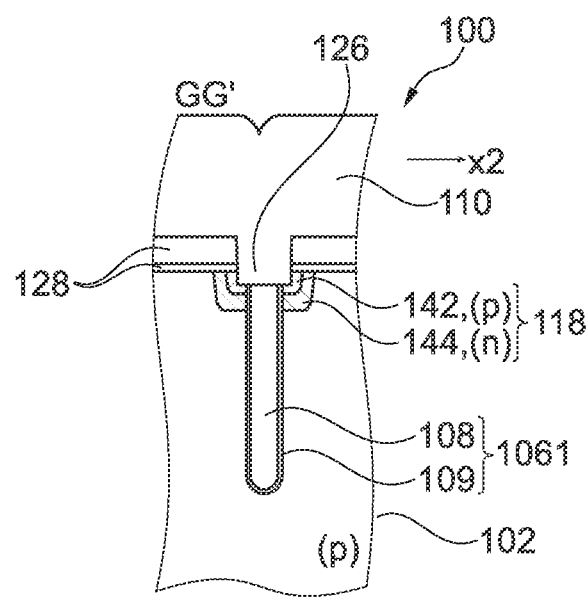

The schematic top view of FIG. 8A and the schematic cross-sectional view of FIG. 8B along intersection line GG' of FIG. 8A illustrate another example of the semiconductor device 100 including a first and a second pn junction isolation as the isolation structure 118.

The first pn junction isolation includes the p-doped region 142 and the n-doped region 144. The second pn junction isolation includes the n-doped region 144 and a p-doped region of the semiconductor body 102 that adjoins the n-doped region 144. The first pn junction isolation surrounds the recess 126 that is filled with the gate contact 110.

The isolation structures 118 including first and second pn junction isolations of FIGS. 7A to 8B may allow for a bi-directional electric insulation between the gate contact 110 and the semiconductor body 102.

In the illustrated examples of the drawings a doping type of the semiconductor regions may also be reversed, i.e. an n-doped region may be formed as a p-doped region, and a p-doped region may be formed as an n-doped region, for example.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing a semiconductor device, comprising:
forming a plurality of trench electrode structures in a semiconductor body, the semiconductor body including a first main surface, the plurality of trench electrode structures extending in parallel along a first lateral direction, a first one of the plurality of trench electrode structures including a gate electrode;
forming a gate contact electrically connected to the gate electrode in a gate contact area, the gate contact area being arranged in a first section along the first lateral direction;
forming a source contact area arranged in a second section along the first lateral direction; and
forming an isolation structure arranged between the gate contact and the semiconductor body in the gate contact area,
wherein a bottom side of the isolation structure is arranged between a bottom side of the first one of the plurality of trench electrode structures and the first main surface along a vertical direction,
wherein the gate contact extends up to or below the first main surface along the vertical direction,
wherein a second one of the plurality of trench electrode structures includes a first source electrode, wherein the source contact area is arranged in the second section along the first lateral direction, wherein the gate contact area is arranged between an edge of the semiconductor body and the source contact area, and wherein a first lateral distance between the first one of the plurality of trench electrode structures and the edge along the first lateral direction is smaller than a second lateral distance between the second one of the plurality of trench electrode structures and the edge along the first lateral direction.

2. The method of claim 1, further comprising:
forming a recess in the isolation structure; and
forming a part of the first one of the plurality of trench electrode structures in the recess.

3. A semiconductor device, comprising:
a semiconductor body including a first main surface;
a plurality of trench electrode structures extending in parallel along a first lateral direction, a first one of the plurality of trench electrode structures including a gate electrode;
a gate contact electrically connected to the gate electrode in a gate contact area, the gate contact area being arranged in a first section along the first lateral direction;
a source contact area arranged in a second section along the first lateral direction; and
an isolation structure arranged between the gate contact and the semiconductor body in the gate contact area,
wherein a bottom side of the isolation structure is arranged between a bottom side of the first one of the plurality of trench electrode structures and the first main surface along a vertical direction,
wherein the gate contact extends up to or below the first main surface along the vertical direction,
wherein a second one of the plurality of trench electrode structures includes a first source electrode, wherein the source contact area is arranged in the second section along the first lateral direction, wherein the gate contact area is arranged between an edge of the semiconductor body and the source contact area, and wherein a first lateral distance between the first one of the plurality of trench electrode structures and the edge along the first lateral direction is smaller than a second lateral distance between the second one of the plurality of trench electrode structures and the edge along the first lateral direction.

4. The semiconductor device of claim 3, wherein the isolation structure comprises a dielectric including at least one of a shallow trench isolation (STI) and a local oxidation of silicon (LOCOS).

5. The semiconductor device of claim 3, wherein a first part of the first one of the plurality of trench electrode structures is arranged between the isolation structure and the first main surface.

6. The semiconductor device of claim 3, wherein the first one of the plurality of trench electrode structures and another one of the plurality of trench electrode structures are merged by a first transverse trench electrode structure extending along the second lateral direction in the gate contact area.

7. The semiconductor device of claim 3, wherein the isolation structure comprises a pn junction isolation.

8. The semiconductor device of claim 7, wherein the pn junction isolation is surrounded by an auxiliary trench electrode structure, and wherein the auxiliary trench electrode structure merges one of the plurality of trench electrode structures in the gate contact area.

9. The semiconductor device of claim 8, wherein a bottom side of the gate contact adjoins each of an electrode in the auxiliary trench electrode structure and the pn junction isolation.

10. The semiconductor device of claim 3, further comprising:
    a first mesa region arranged between the first one of the plurality of trench electrode structures and the second one of the plurality of trench electrode structures; and
    a first source contact extending into the semiconductor body from the first main surface in the source contact area,
    wherein each of the first source electrode and the first mesa region adjoin a bottom side of the first source contact.

11. The semiconductor device of claim 10, wherein an extent of the first source contact along the second lateral direction at the first main surface is larger than an extent of the first mesa region along the second lateral direction at the first main surface.

12. The semiconductor device of claim 11, further comprising:
    a third one of the plurality of trench electrode structures including a second source electrode;
    a second mesa region arranged between the second one of the plurality of trench electrode structures and the third one of the plurality of trench electrode structures;
    a fourth one of the plurality of trench electrode structures including a third source electrode; and
    a third mesa region arranged between the third one of the plurality of trench electrode structures and the fourth one of the plurality of trench electrode structures,
    wherein the source contact in the source contact area extends into the semiconductor body from the first main surface,
    wherein each of the second mesa region, the second source electrode and the third mesa region adjoin a bottom side of the source contact.

13. The semiconductor device of claim 11, further comprising:
    a third one of the plurality of trench electrode structures including a second source electrode; and
    a second mesa region arranged between the second one of the plurality of trench electrode structures and the third one of the plurality of trench electrode structures,
    wherein the second one of the plurality of trench electrode structures and the third one of the plurality of trench electrode structures are merged by a second transverse trench electrode structure extending along the second lateral direction through the second mesa region.

14. The semiconductor device of claim 10, further comprising:
    a source region adjoining the first one of the plurality of trench electrode structures,
    wherein a sidewall portion of the first source contact adjoins the source region.

15. The semiconductor device of claim 14, further comprising:
    a third one of the plurality of trench electrode structures including a second source electrode; and
    a second mesa region arranged between the second one of the plurality of trench electrode structures and the third one of the plurality of trench electrode structures,
    wherein the second one of the plurality of trench electrode structures and the third one of the plurality of trench electrode structures are merged by a second transverse trench electrode structure extending along the second lateral direction through the second mesa region.

16. The semiconductor device of claim 14, further comprising:
    a third one of the plurality of trench electrode structures including a second source electrode;
    a second mesa region arranged between the second one of the plurality of trench electrode structures and the third one of the plurality of trench electrode structures;
    a fourth one of the plurality of trench electrode structures including a third source electrode; and
    a third mesa region arranged between the third one of the plurality of trench electrode structures and the fourth one of the plurality of trench electrode structures,
    wherein the source contact in the source contact area extends into the semiconductor body from the first main surface,
    wherein each of the second mesa region, the second source electrode and the third mesa region adjoin a bottom side of the source contact.

* * * * *